(12) United States Patent
Kapser et al.

(10) Patent No.: US 9,678,168 B2
(45) Date of Patent: Jun. 13, 2017

(54) SENSOR SYSTEM INCLUDING MULTIPLE COMPARATORS

(75) Inventors: Konrad Kapser, Graefelfing (DE); Arnold Rump, Holzkirchen (DE)

(73) Assignee: Infineon Technologies AG, Neubiberg (DE)

(*) Notice: Subject to any disclaimer, the term of this patent is extended or adjusted under 35 U.S.C. 154(b) by 1243 days.

(21) Appl. No.: 12/619,405

(22) Filed: Nov. 16, 2009

(65) Prior Publication Data

US 2011/0115476 A1 May 19, 2011

(51) Int. Cl.
*G01B 7/14* (2006.01)
*G01R 33/00* (2006.01)

(52) U.S. Cl.
CPC .......... *G01R 33/0023* (2013.01); *G01B 7/14* (2013.01); *G01R 33/0029* (2013.01)

(58) Field of Classification Search
CPC .. G01D 5/2225; G01D 5/2233; G01D 5/2241; G01D 5/225; G01D 5/2258; G01D 5/2266; G01D 5/2275; G01D 5/2283; G01D 5/2006; G01D 5/2013; G01D 5/202; G01D 5/2026; G01D 5/2033; G01D 5/204; G01D 5/2046; G01D 5/2053; G01D 5/206; G01D 5/22; G01D 5/2208; G01D 5/2216; G01D 5/14; G01D 5/142; G01D 5/145; G01D 5/147; G01D 5/16; G01D 5/20; G01B 7/02; G01B 7/023; G01B 7/04; G01B 7/046; G01B 7/14; H01L 43/00; H01L 43/06; H01L 43/08; G01R 33/0094; G01R 33/0023; G01R 33/0029; G01R 15/20; G01R 15/202; G01R 15/205

USPC .................................................... 324/207.26
See application file for complete search history.

(56) References Cited

U.S. PATENT DOCUMENTS

| | | | |
|---|---|---|---|
| 4,480,226 A * | 10/1984 | Kuno et al. ................... | 324/247 |
| 4,687,994 A * | 8/1987 | Fulkerson et al. ............ | 324/251 |
| 5,231,351 A | 7/1993 | Kordts et al. | |
| 5,459,405 A | 10/1995 | Wolff | |
| 5,510,706 A * | 4/1996 | Good ............................ | 324/166 |
| 5,578,977 A | 11/1996 | Jansseune | |
| 5,633,593 A | 5/1997 | Wolff et al. | |
| 5,670,886 A * | 9/1997 | Wolff et al. .................. | 324/644 |
| 5,790,046 A * | 8/1998 | Blossfeld .................... | 324/207.2 |
| 6,522,131 B1 | 2/2003 | Hiligsmann et al. | |
| 6,867,680 B1 | 3/2005 | Kulle | |
| 7,956,598 B2 * | 6/2011 | Ariyama ...................... | 323/313 |
| 2004/0164731 A1 * | 8/2004 | Moreno ..................... | 324/207.22 |
| 2005/0099176 A1 * | 5/2005 | Heimlicher ............... | 324/207.26 |
| 2007/0046287 A1 * | 3/2007 | Vervaeke et al. ............ | 324/251 |
| 2007/0132411 A1 | 6/2007 | Stegmann et al. | |
| 2007/0199501 A1 | 8/2007 | Gerner | |

(Continued)

FOREIGN PATENT DOCUMENTS

DE  37 11 062  10/1988
DE  10 2006 049 755  4/2008

*Primary Examiner* — Patrick Assouad
*Assistant Examiner* — David M. Schindler
(74) *Attorney, Agent, or Firm* — Dicke, Billig & Czaja, PLLC

(57) ABSTRACT

A system including a sensor circuit and comparison circuitry. The sensor circuit is configured to provide a sensed signal. The comparison circuitry is configured to receive an input signal that corresponds to the sensed signal. The comparison circuitry provides output signals that switch state at different levels of the input signal.

10 Claims, 5 Drawing Sheets

(56) References Cited

U.S. PATENT DOCUMENTS

2009/0102652 A1* 4/2009 Diener et al. ............... 340/545.6
2009/0134865 A1* 5/2009 Awizio et al. ............. 324/207.2
2010/0264909 A1* 10/2010 Scheller et al. ........... 324/207.2
2011/0103173 A1* 5/2011 May ................................ 366/64

* cited by examiner

SENSOR SYSTEM INCLUDING MULTIPLE COMPARATORS

BACKGROUND

Sensors, referred to as contactless sensors, can be used to detect the position of a sensed object without contacting the sensed object. Contactless sensors include magnetic sensors, inductive sensors, and capacitive sensors.

Magnetic sensors include Hall-effect sensors and magneto-resistive (XMR) sensors. Where, magnetic sensors are used in sensors, such as position sensors, speed sensors, motion sensors, and proximity sensors in automotive, industrial and consumer applications.

Usually, in Hall-effect sensors, current flows through a Hall-effect sensing element or plate and a magnetic field perpendicular to the current flow deflects charge carriers due to the Lorentz force. The deflected charge carriers create a Hall voltage perpendicular to both the magnetic field and the current flow. This Hall voltage can be measured and is directly proportional to the magnetic field.

XMR sensors include anisotropic magneto-resistive (AMR) sensors, giant magneto-resistive (GMR) sensors, tunneling magneto-resistive (TMR) sensors, and colossal magneto-resistive (CMR) sensors.

Often, position sensors are two state switches, where the position sensor switches from one state to another state based on the distance that the sensed object is from the sensor. If the sensed object is closer to the sensor, the position sensor is in one state and if the sensed object is further away from the sensor, the position sensor is in another state. The position sensor, detects that the sensed object is in one of two regions. However, multiple position sensors are needed to detect that the sensed object is in one of more than two regions. This leads to an increase in the number of sensors and wiring, which increases system costs.

For these and other reasons there is a need for the present invention.

SUMMARY

One embodiment described in the disclosure provides a system including a sensor circuit and comparison circuitry. The sensor circuit is configured to provide a sensed signal. The comparison circuitry is configured to receive an input signal that corresponds to the sensed signal. The comparison circuitry provides output signals that switch state at different levels of the input signal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
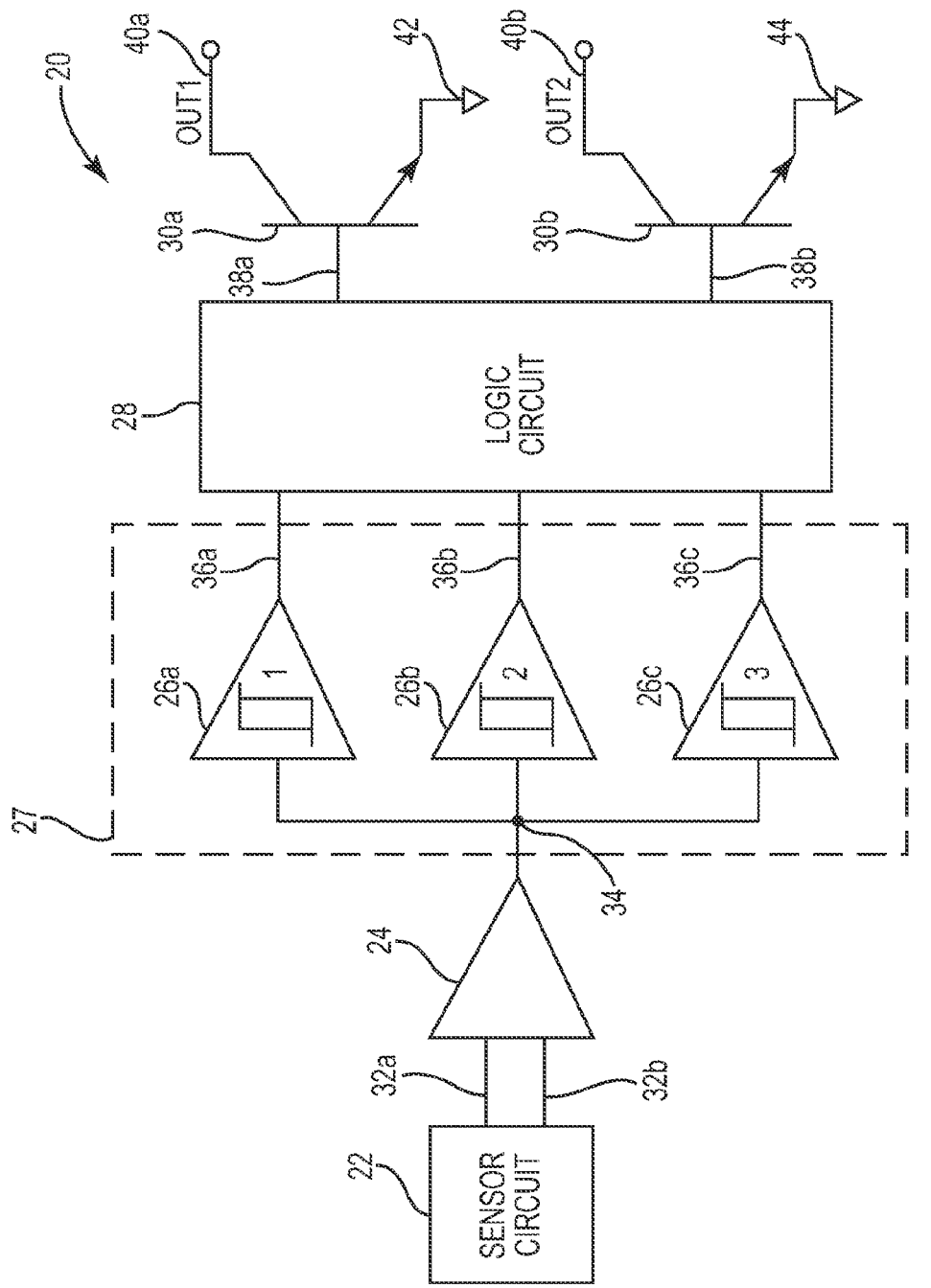
FIG. 1 is a diagram illustrating one embodiment of a sensor system that indicates the position of an object in one of four regions.

FIG. 1 is a diagram illustrating one embodiment of a sensor system 20 that senses the position of an object (not shown) and indicates the position of the object in one of four regions. In one embodiment, sensor system 20 is a magnetic field position sensor. In one embodiment, sensor system 20 is a radio frequency (RF) position sensor. In one embodiment, sensor system 20 is part of a gear shift assembly. In other embodiments, sensor system 20 senses and indicates the position of an object in one region of n number of regions.

Sensor system 20 includes a sensor circuit 22, an amplifier 24, three comparators 26a-26c, a logic circuit 28 and two output transistors 30a and 30b. Sensor circuit 22 is electrically coupled to the inputs of amplifier 24 via sensed signal paths 32a and 32b and the output of amplifier 24 is electrically coupled to each of the comparators 26a-26b via input signal path 34.

Sensor circuit 22 senses the object and provides sensed signals to amplifier 24 via sensed signal paths 32a and 32b. Amplifier 24 receives the sensed signals at 32a and 32b and provides an amplified input signal to comparators 26a-26c via input path 34, where the amplified input signal at 34 corresponds to the sensed signals at 32a and 32b. In one embodiment, sensor circuit 22 is a magnetic sensor circuit. In one embodiment, sensor circuit 22 is an inductive sensor circuit. In one embodiment, sensor circuit 22 is a capacitive sensor circuit. In one embodiment, sensor circuit 22 is a Hall-effect sensor circuit. In one embodiment, sensor circuit 22 is a magneto-resistive (XMR) sensor circuit.

Each of the three comparators 26a-26c receives the input signal at 34 and compares the input signal at 34 to different threshold values. Also, each of the three comparators 26a-26c provides an output signal to logic circuit 28. First comparator 26a is electrically coupled to logic circuit 28 via first output path 36a, second comparator 26b is electrically coupled to logic circuit 28 via second output path 36b, and third comparator 26c is electrically coupled to logic circuit 28 via third output path 36c. In other embodiments, sensor system 20 includes n comparators that provide n output signals to logic circuit 28.

First comparator 26a receives the input signal at 34 and compares the input signal at 34 to first threshold values. If the input signal at 34 is above the first threshold values, first comparator 26a provides a first output signal at 36a in one state, such as a low state. If the input signal at 34 is below the first threshold values, first comparator 26a provides the first output signal at 36a in another state, such as a high state.

Second comparator 26b receives the input signal at 34 and compares the input signal at 34 to second threshold values. If the input signal at 34 is above the second threshold values, second comparator 26b provides a second output signal at 36b in one state, such as a low state. If the input signal at 34 is below the second threshold values, second comparator 26b provides the second output signal at 36b in another state, such as a high state.

Third comparator 26c receives the input signal at 34 and compares the input signal at 34 to third threshold values. If the input signal at 34 is above the third threshold values, third comparator 26c provides a third output signal at 36c in one state, such as a low state. If the input signal at 34 is below the second threshold values, third comparator 26c provides the third output signal at 36c in another state, such as a high state.

Comparators, such as comparators 26a-26c, are part of comparison circuitry 27. In other embodiments, comparison circuitry 27 does not include comparators, such as comparators 26a-26c, and comparisons of the input signal to the different threshold values are done via different comparison circuitry 27, such as in a software solution where the input signal is sampled via an analog-to-digital (AD) converter (not shown) and comparisons are made via software calculations in a controller (not shown).

Logic circuit 28 receives the first, second, and third output signals at 36a-36c and provides logical output signals that indicate which one of the four regions the sensed object is in. Logic circuit 28 is electrically coupled to the input of first output transistor 30a via logic output path 38a and to the input of second output transistor 30b via logic output path 38b. First output transistor 30a has a first output at 40a and is electrically coupled to a reference, such as ground, at 42. Second output transistor 30b has a second output at 40b and is electrically coupled to a reference, such as ground, at 44. In other embodiments, logic circuit 28 provides other signals that indicate which region the sensed object is in, signals such as pulse width modulated (PWM) signals, local interconnect network (LIN) signals, and/or controller area network (CAN) signals.

Logic circuit 28 receives the three output signals at 36a-36c and provides two logical output signals at 38a and 38b that indicate which one of four regions the object is in. The first logical output signal at 38a controls first output transistor 30a and the second logical output signal at 38b controls second output transistor 30b to output first and second output signals at 40a and 40b, respectively. In other embodiments, logic circuit 28 receives n comparator output signals from n comparators and logic circuit 28 provides logical output signals to indicate which one of n+1 regions the object is in.

In operation, the sensed object is in one of four regions, where the first region is furthest away from sensor system 20, the second region is closer to sensor system 20 than the first region but further away from sensor system 20 than the third region, the third region is closer to sensor system 20 than the second region but further away from sensor system 20 than the fourth region, and the fourth region is closest to sensor system 20.

If the sensed object is in the first region, the input signal at 34 that corresponds to the sensed signals at 32a and 32b, is below the first, second, and third threshold values and all three comparators 26a-26c output a high state. If the sensed object is in the second region, the input signal at 34 is above the first threshold values and below the second and third threshold values, such that first comparator 26a outputs a low state and second and third comparators 26b and 26c output high states. If the sensed object is in the third region, the input signal at 34 is above the first and second threshold values and below the third threshold values, such that first and second comparators 26a and 26b output low states and third comparator 26c outputs a high state. If the sensed object is in the fourth region, the input signal at 34 is above the first, second, and third threshold values and each of the three comparators 26a-26c outputs a low state.

Logic circuit 28 receives the comparator output signals at 36a-36c and outputs two logical output signals at 38a and 38b, which control output transistors 30a and 30b to provide output signals at 40a and 40b. If the sensed object is in the first region, all three comparators 26a-26c output a high state and logic circuit 28 controls output transistors 30a and 30b to output high states in the output signals at 40a and 40b. If the sensed object is in the second region, such that first comparator 26a outputs a low state and second and third comparators 26b and 26c output high states. Logic circuit 28 receives the one low state and two high states and controls output transistor 30a to output a high state and output transistor 30b to output a low state. If the sensed object is in the third region, such that first and second comparators 26a and 26b output low states and third comparator 26c outputs a high state. Logic circuit 28 receives the two low states and the one high state and controls output transistor 30a to output a low state and output transistor 30b to output a high state. If the sensed object is in the fourth region, such that each of the comparators 26a-26c outputs a low state. Logic circuit 28 receives the three low states and controls output transistors 30a and 30b to output low states.

In other embodiments, sensor system 20 has n number of comparators, where each comparator has different threshold values. The input signal at 34 is compared via the n comparators to produce n comparator output signals. Logic circuit 28 receives the n comparator output signals and indicates which region of up to n+1 regions the sensed object is in.

Sensor system 20 senses the sensed object in one of more than two regions. Using sensor system 20 reduces the number of sensors and wiring, which reduces system costs.

Figure 2:
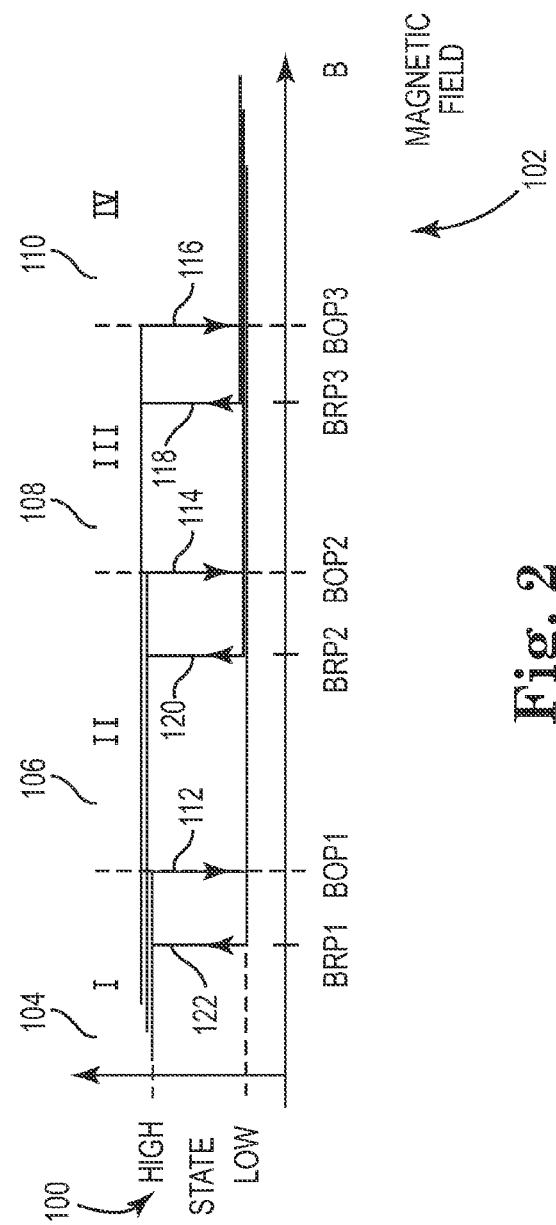
FIG. 2 is a diagram illustrating the operation of the sensor system of FIG. 1, where the sensor circuit is a Hall-effect magnetic field sensor.

FIG. 2 is a diagram illustrating the operation of sensor system 20, where sensor circuit 22 is a Hall-effect magnetic field sensor. The high and low states at 100 of comparators 26a-26c are graphed versus the strength of the magnetic field B at 102. As the sensed object gets closer to sensor system 20, the magnetic field gets stronger. In region I at 104, the magnetic field is weak and the object is furthest away from sensor system 20. As the object moves closer to sensor system 20, it passes through region II at 106, region III at 108, and into region IV at 110.

In region I at 104, the input signal at 34 that corresponds to the sensed signals at 32a and 32b, is below the first, second, and third threshold values and each of the three comparators 26a-26c outputs a high state. As the object moves closer to sensor system 20, comparator 26a switches from a high state to a low state at 112, which is operating point one (BOP1). In region II at 106, the input signal at 34 is above the first threshold values and below the second and third threshold values, such that first comparator 26a outputs a low state and second and third comparators 26b and 26c output high states. As the object moves closer to sensor system 20, comparator 26b switches from a high state to a low state at 114, which is operating point two (BOP2). In region III at 108, the input signal at 34 is above the first and second threshold values and below the third threshold values, such that first and second comparators 26a and 26b output low states and third comparator 26c outputs a high state. As the object moves closer to sensor system 20, comparator 26c switches from a high state to a low state at 116, which is operating point three (BOP3). In region IV at 110, the input signal at 34 is above the first, second, and third threshold values and each of the three comparators 26a-26c outputs a low state.

As the sensed object moves further away from sensor system 20, the magnetic field gets weaker. The object moves from region IV at 110, to region III at 108, to region II at 106, to region I at 104. Each of the three comparators 26a-26c is a hysteresis comparator that switches from a low state to a high state at a release point that is different than the operating point for that comparator. This stabilizes sensor system 20, such that oscillations between regions due to electrical noise or mechanical vibrations are reduced.

In region IV at 110, the input signal at 34 is above the first, second, and third threshold values and each of the three comparators 26a-26c outputs a low state. As the object moves further away from sensor system 20, comparator 26c switches from a low state to a high state at 118, which is release point three (BRP3). In region III at 108, the input signal at 34 is above the first and second threshold values and below the third threshold values, such that first and second comparators 26a and 26b output low states and third comparator 26c outputs a high state. As the object moves further away from sensor system 20, comparator 26b switches from a low state to a high state at 120, which is release point two (BRP2). In region II at 106, the input signal at 34 is above the first threshold values and below the second and third threshold values, such that first comparator 26a outputs a low state and second and third comparators 26b and 26c output high states. As the object moves further away from sensor system 20, comparator 26a switches from a low state to a high state at 122, which is release point one (BRP1). In region I at 104, the input signal at 34 that corresponds to the sensed signals at 32a and 32b, is below the first, second, and third threshold values and each of the three comparators 26a-26c outputs a high state.

Figure 3:
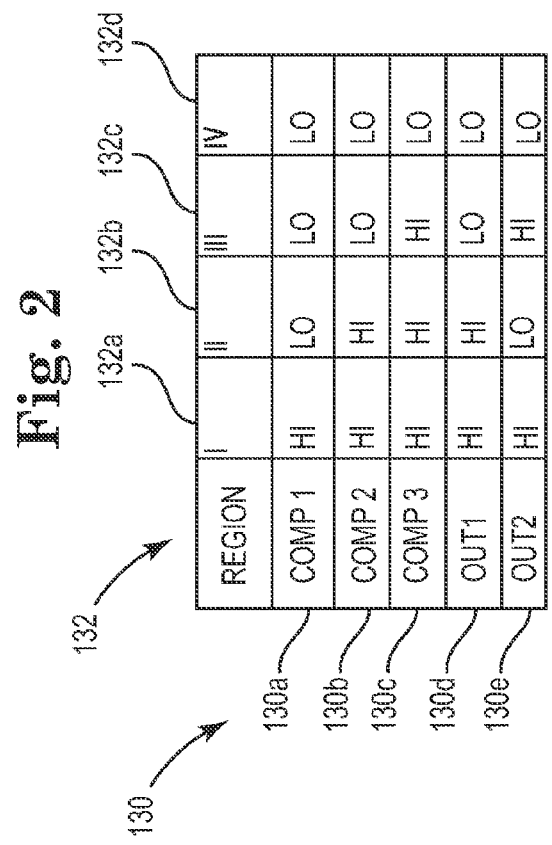
FIG. 3 is a table illustrating the states of comparators and output signals versus regions.

FIG. 3 is a table illustrating the states of comparators 26a-26c and output signals 40a-40b at 130 versus region at 132. Comparator 26a is referred to as Comp1 at 130a, comparator 26b is referred to as Comp2 at 130b, and comparator 26c is referred to as Comp3 at 130c. Also, output signal 40a is referred to as Out1 at 130d and output signal 40b is referred to as Out2 at 130e.

In region I at 132a, each of the comparators 26a-26c outputs a high state and logic circuit 28 controls output transistors 30a and 30b to output high states in the output signals at 40a and 40b. In region II at 132b, first comparator 26a outputs a low state and second and third comparators 26b and 26c output high states, and logic circuit 28 controls output transistor 30a to output a high state and output transistor 30b to output a low state. In region III at 132c, first and second comparators 26a and 26b output low states and third comparator 26c outputs a high state. Logic circuit 28 receives the two low states and the one high state and controls output transistor 30a to output a low state and output transistor 30b to output a high state. In region IV at 132d, each of the comparators 26a-26c outputs a low state and logic circuit 28 controls output transistors 30a and 30b to output low states.

Figure 4:
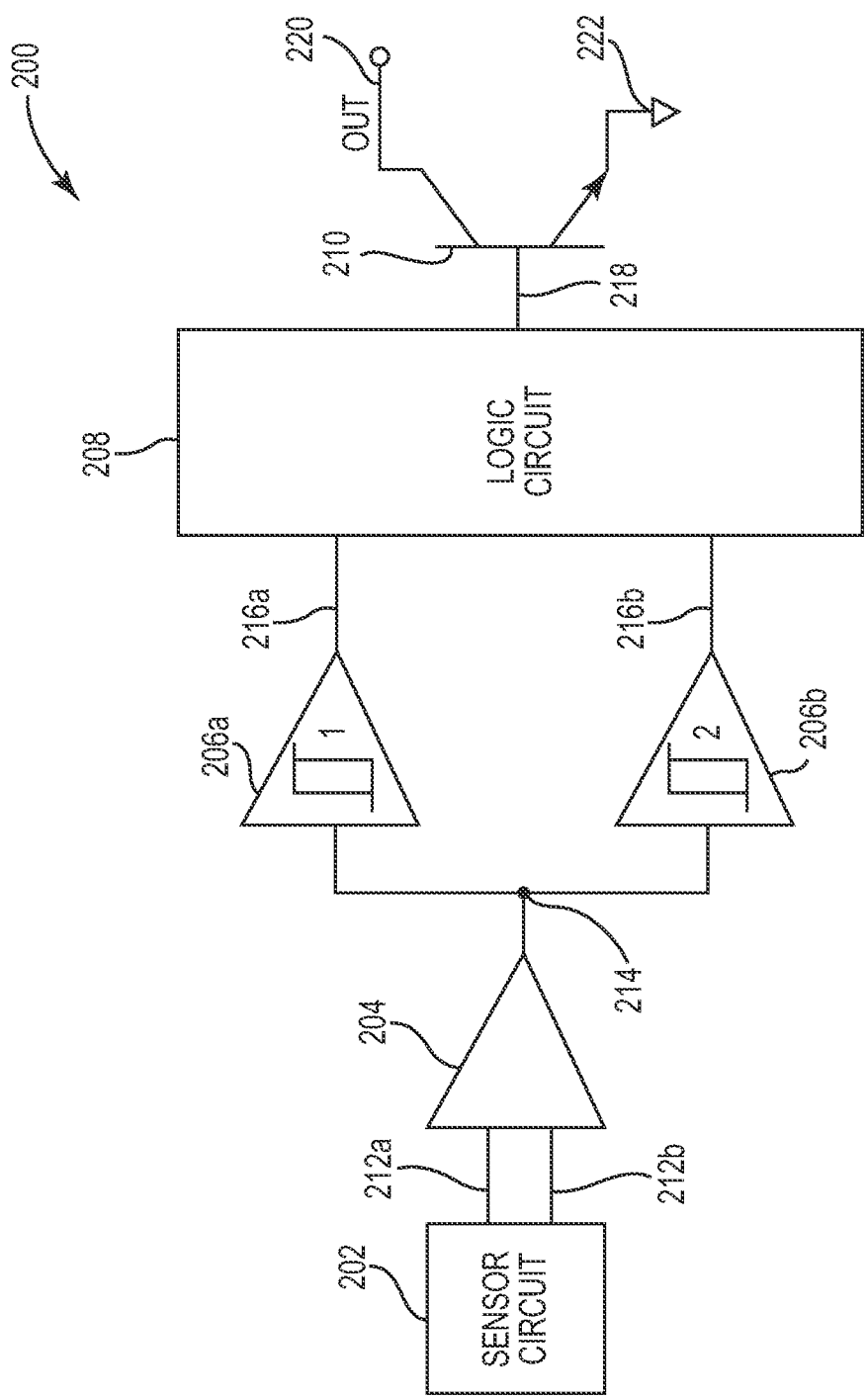
FIG. 4 is a diagram illustrating one embodiment of a sensor system that indicates whether the strength of a magnetic field is in a middle region of three regions.

FIG. 4 is a diagram illustrating one embodiment of a sensor system 200 that senses whether the strength of a magnetic field, such as the magnetic field from an object, is in the middle region of three regions. In one embodiment, sensor system 200 is part of a position sensor that senses the position of the object. In one embodiment, sensor system 200 is part of a security system. In other embodiments, sensor system 200 senses and indicates whether the strength of the magnetic field is in one region of n regions.

Sensor system 200 includes a sensor circuit 202, an amplifier 204, two comparators 206a and 206b, a logic circuit 208, and an output transistor 210. Sensor circuit 202 is electrically coupled to the inputs of amplifier 204 via sensed signal paths 212a and 212b, and the output of amplifier 204 is electrically coupled to each of the comparators 206a and 206b via input signal path 214.

Sensor circuit 202 senses the magnetic field and provides sensed signals to amplifier 204 via sensed signal paths 212a and 212b. Amplifier 204 receives the sensed signals at 212a and 212b and provides an amplified input signal to comparators 206a and 206b via input path 214, where the amplified input signal at 214 corresponds to the sensed signals at 212a and 212b. In one embodiment, sensor circuit 202 is a magnetic sensor circuit. In one embodiment, sensor circuit 202 is an inductive sensor circuit. In one embodiment, sensor circuit 202 is a capacitive sensor circuit. In one embodiment, sensor circuit 202 is a Hall-effect sensor circuit. In one embodiment, sensor circuit 202 is an XMR sensor circuit.

Each of the comparators 206a and 206b receives the input signal at 214 and compares the input signal at 214 to different threshold values. Also, each of the comparators 206a and 206b provides an output signal to logic circuit 208. First comparator 206a is electrically coupled to logic circuit 208 via first output path 216a and second comparator 206b is electrically coupled to logic circuit 208 via second output path 216b. In other embodiments, sensor system 200 includes n comparators that provide n output signals to logic circuit 208.

First comparator 206a receives the input signal at 214 and compares the input signal at 214 to first threshold values. If the input signal at 214 is above the first threshold values, first comparator 206a provides a first output signal at 216a in one state, such as a low state. If the input signal at 214 is below the first threshold values, first comparator 206a provides the first output signal at 216a in another state, such as a high state.

Second comparator 206b receives the input signal at 214 and compares the input signal at 214 to second threshold values. If the input signal at 214 is above the second threshold values, second comparator 206b provides a second output signal at 216b in one state, such as a low state. If the input signal at 214 is below the second threshold values, second comparator 206b provides the second output signal at 216b in another state, such as a high state.

Logic circuit 208 receives the first and second output signals at 216a and 216b and provides a logical output signal that indicates whether the strength of the magnetic filed is in the middle region of three regions. Logic circuit 208 is electrically coupled to the input of output transistor 210 via logic output path 218. Output transistor 210 has an output at 220 and is electrically coupled to a reference, such as ground, at 222. In other embodiments, logic circuit 208 provides other signals that indicate which region the sensed object is in, signals such as pulse width modulated (PWM) signals, local interconnect network (LIN) signals, and/or controller area network (CAN) signals.

Logic circuit 208 receives the output signals at 216a and 216b and provides a logical output signal at 218 that indicates whether the strength of the magnetic field is in the middle region of three regions. The logical output signal at 218 controls output transistor 210 to output an output signal at 220. In other embodiments, logic circuit 208 receives n comparator output signals from n comparators and logic circuit 208 provides logical output signals to indicate which one of n+1 regions the strength of the magnetic field is in.

In operation, the sensed strength of the magnetic field is in one of three regions. The magnetic field strength is weakest in the first region, stronger in the second region than in the first region but weaker in the second region than in the third region, and strongest in the third region.

In the first region, the input signal at 214 that corresponds to the sensed signals at 212a and 212b is below the first and second threshold values and both comparators 206a and 206b output a high state. In the second region, the input signal at 214 is above the first threshold values and below the second threshold values, such that first comparator 206a outputs a low state and second comparator 206b outputs a high state. In the third region, the input signal at 214 is above the first and second threshold values, such that first and second comparators 206a and 206b output low states.

Logic circuit 208 receives the comparator output signals at 216a and 216b and outputs a logical output signal at 218, which controls output transistor 210 to provide an output signal at 220. In the first region, each of the comparators 206a and 206b outputs a high state and logic circuit 208 controls output transistors 210 to output a low state in the output signal at 220. In the second region, first comparator 206a outputs a low state and second comparator 206b outputs a high state. Logic circuit 208 receives the low state and the high state and controls output transistor 210 to output a high state in the output signal at 220. In the third region, first and second comparators 206a and 206b output low states and logic circuit 208 controls output transistor 210 to output a low state in the output signal at 220.

In other embodiments, sensor system 200 has n number of comparators, where each comparator has different threshold values. The input signal at 214 is compared via the n comparators to produce n comparator output signals. Logic circuit 208 receives the n comparator output signals and indicates which region of up to n+1 regions the strength of the magnetic field is in.

Sensor system 200 indicates whether the strength of the magnetic field is in the second region via a high state in the output signal at 220. If the strength of the magnetic field is lower and in the first region or higher and in the third region, sensor system 200 outputs a low state in the output signal at 220.

In one embodiment, sensor system 200 is used in a security system, where sensor system 200 detects the position of an object, such as a door/window sensor magnet. If the strength of the magnetic field is in the second region, the door/window is closed and if the strength of the magnetic field is in the first region, the door/window is open. Also, if someone tries to over-ride the door/window sensor via an external magnet, the strength of the magnetic field may be pushed into the third region, where sensor system 200 outputs a low state in the output signal at 220, which alerts the security system to a potential break-in at the door/window.

Figure 5:
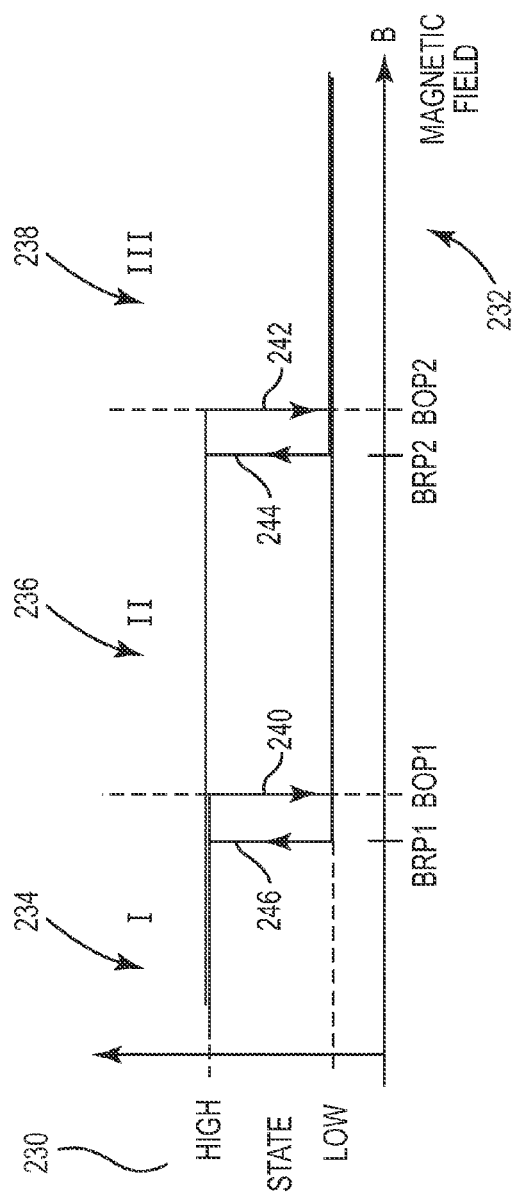
FIG. 5 is a diagram illustrating the operation of the sensor system of FIG. 4, where the sensor circuit is a Hall-effect magnetic field sensor.

FIG. 5 is a diagram illustrating the operation of sensor system 200, where sensor circuit 202 is a Hall-effect magnetic field sensor. The high and low states at 230 of comparators 206a and 206b are graphed versus the strength of the magnetic field B at 232. In region I at 234, the magnetic field is weakest. In region II at 236, the magnetic field is stronger than in region I, but weaker than in region III at 238 where the magnetic field is strongest.

In region I at 234, the input signal at 214 that corresponds to the sensed signals at 212a and 212b, is below the first and second threshold values and each of the comparators 206a and 206b outputs a high state. As the magnetic field strength increases, such as by moving an object closer to sensor system 200, comparator 206a switches from a high state to a low state at 240, which is operating point one (BOP1). In region II at 236, the input signal at 214 is above the first threshold values and below the second threshold values, such that first comparator 206a outputs a low state and second comparator 206b outputs a high state. As the magnetic field strength increases, such as by moving an object closer to sensor system 200, comparator 206b switches from a high state to a low state at 242, which is operating point two (BOP2). In region III at 238, the input signal at 214 is above the first and second threshold values and each of the comparators 206a and 206b outputs a low state.

As the magnetic field decreases, such as by moving an object away from sensor system 200, the strength of the magnetic field moves from region III at 238, to region II at 236, to region I at 234. Each of the comparators 206a and 206b is a hysteresis comparator that switches from a low state to a high state at a release point that is different than the operating point for that comparator. This stabilizes sensor system 200, such that oscillations between regions due to electrical noise or mechanical vibrations are reduced.

In region III at 238, the input signal at 214 is above the first and second threshold values and each of the comparators 206a and 206b outputs a low state. As the magnetic field decreases, comparator 206b switches from a low state to a high state at 244, which is release point two (BRP2). In region II at 236, the input signal at 214 is above the first threshold values and below the second threshold values, such that first comparator 206a outputs a low state and second comparator 206b outputs a high state. As the magnetic field decreases, comparator 206a switches from a low state to a high state at 246, which is release point one (BRP1). In region I at 234, the input signal at 214 is below the first and second threshold values and each of the comparators 206a and 206b outputs a high state.

Figure 6:
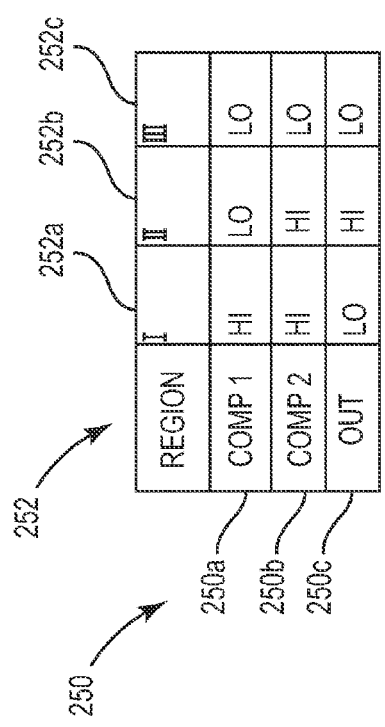
FIG. 6 is a table illustrating the states of comparators and an output signal versus regions in the sensor system of FIG. 4.

FIG. 6 is a table illustrating the states of comparators 206a and 206b and output signal 220 at 250 versus region at 252. Comparator 206a is referred to as Comp1 at 250a, comparator 206b is referred to as Comp2 at 250b, and output signal 220 is referred to as Out at 250c.

In region I at 252a, each of the comparators 206a and 206b outputs a high state and logic circuit 208 controls output transistor 210 to output a low state in the output signal at 220. In region II at 252b, first comparator 206a outputs a low state and second comparator 206b outputs a high state, and logic circuit 208 controls output transistor 210 to output a high state. In region III at 252c, first and second comparators 206a and 206b output low states and logic circuit 208 outputs a low state.

Sensor system 200 senses the strength of a magnetic field, such as a magnetic field from a sensed object and/or an external magnet, and indicates the strength of the magnetic field via more than two regions. Sensor system 200 provides a logical output signal via logic circuit 208 in sensor system 200. Using sensor system 200 in a security system application can improve security.

Figure 7:
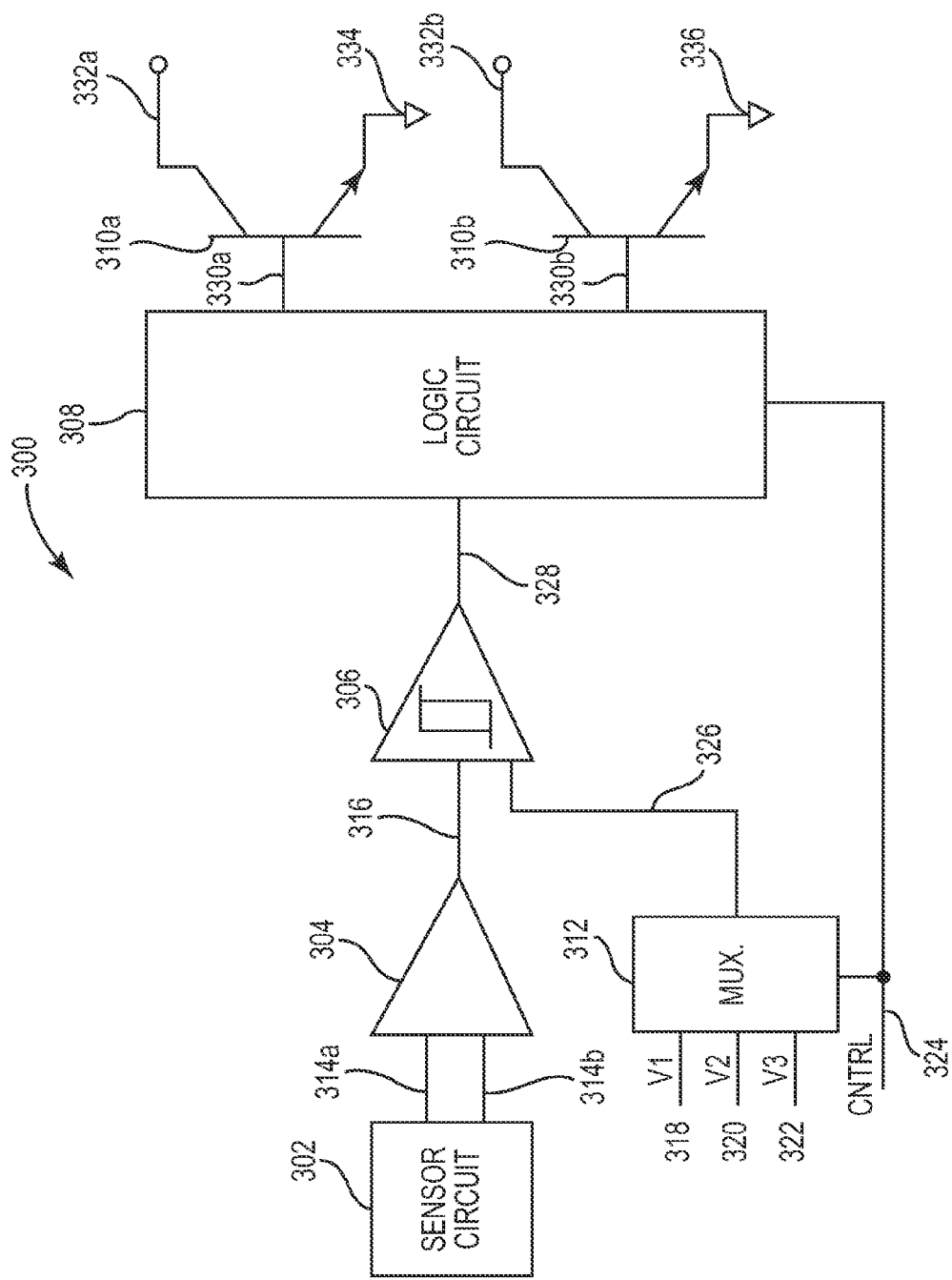
FIG. 7 is a diagram illustrating one embodiment of a sensor system 300 that includes a multiplexer and multiple threshold voltages.

FIG. 7 is a diagram illustrating one embodiment of a sensor system 300 that senses the position of an object (not shown) and indicates the position of the object in one of four regions. In one embodiment, sensor system 300 is a magnetic field position sensor. In one embodiment, sensor system 300 is a radio frequency (RF) position sensor. In one embodiment, sensor system 300 is part of a gear shift assembly. In other embodiments, sensor system 300 senses and indicates the position of an object in one region of n number of regions.

Sensor system 300 includes a sensor circuit 302, an amplifier 304, a comparator 306, a logic circuit 308, two output transistors 310a and 310b, and a multiplexer 312. Sensor circuit 302 is electrically coupled to the inputs of amplifier 304 via sensed signal paths 314a and 314b and the output of amplifier 304 is electrically coupled to comparator 306 via input signal path 316.

Sensor circuit 302 senses the object and provides sensed signals to amplifier 304 via sensed signal paths 314a and 314b. Amplifier 304 receives the sensed signals at 314a and 314b and provides an amplified input signal to comparator 306 via input path 316, where the amplified input signal at 316 corresponds to the sensed signals at 314a and 314b. In one embodiment, sensor circuit 302 is a magnetic sensor circuit. In one embodiment, sensor circuit 302 is an inductive sensor circuit. In one embodiment, sensor circuit 302 is a capacitive sensor circuit. In one embodiment, sensor circuit 302 is a Hall-effect sensor circuit. In one embodiment, sensor circuit 302 is a magneto-resistive (XMR) sensor circuit.

Multiplexer 312 receives three threshold voltages V1, V2, and V3. Multiplexer 312 receives threshold voltage V1 at 318, threshold voltage V2 at 320, and threshold voltage V3 at 322. Also, multiplexer 312 receives control signal CNTRL at 324 from control logic (not shown for clarity), such as a controller, a microprocessor, or another logic circuit. The output of multiplexer 312 is electrically coupled to a threshold voltage input of comparator 306 via threshold voltage path 326. Control signal CNTRL at 324 controls multiplexer 312 to provide each of the three different threshold voltages V1, V2, and V3 to comparator 306.

Comparator 306 receives the input signal at 316 and compares the input signal at 316 to the threshold voltages V1, V2, and V3 provided via multiplexer 312. Comparator 306 is electrically coupled to logic circuit 308 via comparator output path 328 and comparator 306 provides an output signal to logic circuit 308 via comparator output path 328 for each comparison to one of the three threshold voltages V1, V2, and V3. Thus, if multiplexer 312 provides the three different threshold voltages V1, V2, and V3 to comparator 306 over a given period of time, comparator 306 provides three output signals to logic circuit 308 over the same given period of time. In other embodiments, sensor system 300 includes n threshold voltages and comparator 306 compares the input signal at 316 to n threshold voltages and provides n corresponding output signals to logic circuit 308.

Comparator 306 receives threshold voltage V1 at 326 via multiplexer 312 and compares the input signal at 316 to the first threshold voltage V1. If the input signal at 316 is above the first threshold voltage V1, comparator 306 provides a first output signal at 328 in one state, such as a low state. If the input signal at 316 is below the first threshold voltage V1, comparator 306 provides the first output signal at 328 in another state, such as a high state.

Comparator 306 receives threshold voltage V2 at 326 via multiplexer 312 and compares the input signal at 316 to the second threshold voltage V2. If the input signal at 316 is above the second threshold voltage V2, comparator 306 provides a second output signal at 328 in one state, such as a low state. If the input signal at 316 is below the second threshold voltage V2, comparator 306 provides the second output signal at 328 in another state, such as a high state.

Comparator 306 receives threshold voltage V3 at 326 via multiplexer 312 and compares the input signal at 316 to the third threshold voltage V3. If the input signal at 316 is above the third threshold voltage V3, comparator 306 provides a third output signal at 328 in one state, such as a low state. If the input signal at 316 is below the third threshold voltage V1, comparator 306 provides the third output signal at 328 in another state, such as a high state.

Logic circuit 308 receives the first, second, and third output signals at 328 and control signal CNTRL at 324. Logic circuit 308 provides logical output signals that indicate which one of the four regions the sensed object is in. Logic circuit 308 is electrically coupled to the input of first output transistor 310a via logic output path 330a and to the input of second output transistor 310b via logic output path 330b. First output transistor 310a has a first output at 332a and is electrically coupled to a reference, such as ground, at 334. Second output transistor 310b has a second output at 332b and is electrically coupled to a reference, such as ground, at 336. In other embodiments, logic circuit 308 provides other signals that indicate which region the sensed object is in, signals such as pulse width modulated (PWM) signals, local interconnect network (LIN) signals, and/or controller area network (CAN) signals.

Logic circuit 308 receives the three output signals at 328 and provides two logical output signals at 330a and 330b that indicate which one of four regions the object is in. The first logical output signal at 330a controls first output transistor 310a and the second logical output signal at 330b controls second output transistor 310b to output first and second output signals at 332a and 332b, respectively. In other embodiments, logic circuit 308 receives n comparator output signals and logic circuit 308 provides logical output signals to indicate which one of n+1 regions the object is in.

In operation, the sensed object is in one of four regions, where the first region is furthest away from sensor system 300, the second region is closer to sensor system 300 than the first region but further away from sensor system 300 than the third region, the third region is closer to sensor system 300 than the second region but further away from sensor system 300 than the fourth region, and the fourth region is closest to sensor system 300.

If the sensed object is in the first region, the input signal at 316 that corresponds to the sensed signals at 314a and 314b is below the first, second, and third threshold voltages V1, V2, and V3 and comparator 306 outputs three high states. If the sensed object is in the second region, the input signal at 316 is above the first threshold voltage V1 and below the second and third threshold voltages V2 and V3, such that comparator 306 outputs a low state via the comparison to the first threshold voltage V1 and high states via the comparisons to the second and third threshold voltages V2 and V3. If the sensed object is in the third region, the input signal at 316 is above the first and second threshold voltages V1 and V2 and below the third threshold voltage V3, such that comparator 306 outputs low states via the comparisons to the first and second threshold voltages V1 and V2 and a high state via the comparison to the third threshold voltage V3. If the sensed object is in the fourth region, the input signal at 316 is above the first, second, and third threshold voltages V1, V2, and V3 and comparator 306 outputs three low states.

Logic circuit 308 receives the comparator output signals at 328 and control signal CNTRL at 324 and outputs two logical output signals at 330a and 330b, which control output transistors 310a and 310b to provide output signals at 332a and 332b. If the sensed object is in the first region, logic circuit 308 controls output transistors 310a and 310b to output high states in the output signals at 332a and 332b. If the sensed object is in the second region, logic circuit 308 receives the one low state and two high states and controls output transistor 310a to output a high state and output transistor 310b to output a low state. If the sensed object is in the third region, logic circuit 308 receives the two low states and the one high state and controls output transistor 310a to output a low state and output transistor 310b to output a high state. If the sensed object is in the fourth region, logic circuit 28 receives the three low states and controls output transistors 30a and 30b to output low states.

In other embodiments, sensor system 300 has n number of different threshold voltages. The input signal at 316 is compared via the n threshold voltages to produce n comparator output signals. Logic circuit 308 receives the n comparator output signals and indicates which region of up to n+1 regions the sensed object is in.

Sensor system 300 senses the sensed object in one of more than two regions. Using sensor system 300 reduces the number of sensors and wiring, which reduces system costs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
a sensor circuit configured to provide a sensed signal that corresponds to a distance between the sensor circuit and an object;
comparison circuitry configured to receive an input signal that corresponds to the sensed signal and to provide output signals that switch state at different levels of the input signal to indicate different distances between the sensor circuit and the object, wherein the comparison circuitry comprises:
three hysteresis comparators, wherein the output signals comprise three output signals, with each hysteresis comparator providing one of the three output signals; and
a logic circuit that receives the three output signals and provides two logic circuit outputs based on the three output signals, wherein the two logic circuit outputs together provide four binary logic states, wherein each of the four binary logic states indicates one of four different ranges of distances between the sensor circuit and the object.

2. The system of claim 1, wherein the sensor circuit is one of a Hall effect sensor circuit and a magneto-resistive sensor circuit.

3. The system of claim 1, wherein the sensor circuit is one of an inductive sensor circuit and a capacitive sensor circuit.

4. The system of claim 1, comprising:
an amplifier configured to receive the sensed signal and provide the input signal.

5. The system of claim 1, comprising:
a first output transistor connected to one of the two logic circuit outputs to provide a first transistor output; and
a second output transistor connected to another one of the two logic circuit outputs to provide a second transistor output.

6. The system of claim 1, wherein the sensor circuit and the comparison circuitry are part of a position sensor.

7. The system of claim 1, wherein the sensor circuit and the comparison circuitry are part of a gear shift assembly.

8. A method of sensing, comprising:
sensing an object via a sensor circuit and providing a sensed signal that corresponds to a distance between the sensor circuit and the object;
receiving an input signal that corresponds to the sensed signal;
comparing the input signal via three hysteresis comparators;
providing three output signals from the three hysteresis comparators such that each of the three hysteresis comparators provides one of three output signals; and
providing two logic circuit outputs based on the three output signals, wherein the two logic circuit outputs together provide four binary logic states that indicate four different levels of the input signal, which indicate four different ranges of distances between the sensor circuit and the object.

9. The method of claim 8, wherein the sensing the object comprises:
sensing the object via a magnetic sensor circuit.

10. The method of claim 8, wherein the sensing the object comprises one of:
sensing the object via an inductive sensor circuit; and
sensing the object via a capacitive sensor circuit.

* * * * *